US012768900B2

(12) United States Patent
Hayashi

(10) Patent No.: US 12,768,900 B2
(45) Date of Patent: Oct. 20, 2026

(54) POWER CONVERTER AND ISLANDING OPERATION DETECTION METHOD

(71) Applicant: FUJI ELECTRIC CO., LTD., Kanagawa (JP)

(72) Inventor: Takashi Hayashi, Tokyo (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 125 days.

(21) Appl. No.: 18/969,791

(22) Filed: Dec. 5, 2024

(65) Prior Publication Data

US 2025/0216475 A1 Jul. 3, 2025

(30) Foreign Application Priority Data

Dec. 28, 2023 (JP) ................................ 2023-223534

(51) Int. Cl.

*G01R 31/40* (2020.01)
*H02J 3/388* (2026.01)
*H02M 7/5395* (2006.01)

(52) U.S. Cl.

CPC .............. *G01R 31/40* (2013.01); *H02J 3/388* (2020.01); *H02M 7/5395* (2013.01)

(58) Field of Classification Search

None

See application file for complete search history.

(56) References Cited

U.S. PATENT DOCUMENTS

| | | | | |
|---|---|---|---|---|
| 11,777,322 | B2 * | 10/2023 | Chen | G05B 13/042 700/287 |
| 2007/0179724 | A1 | 8/2007 | Mabuchi et al. | |
| 2011/0309684 | A1 * | 12/2011 | Song | H02J 3/00 307/87 |
| 2022/0190604 | A1 * | 6/2022 | Chen | G01R 19/2513 |
| 2024/0072537 | A1 * | 2/2024 | Fonkwe Fongang | G01R 31/40 |

FOREIGN PATENT DOCUMENTS

| | | |
|---|---|---|
| JP | 2007-215392 | 8/2007 |
| JP | 2015-010703 | 1/2015 |
| JP | 2017-005859 | 1/2017 |
| JP | 2017-051063 | 3/2017 |

* cited by examiner

*Primary Examiner* — Richard Isla

(74) *Attorney, Agent, or Firm* — IPUSA, PLLC

(57) ABSTRACT

A power converter includes an inverter including an inverter circuit configured to convert a DC power into an AC power, and a reactor provided between the inverter circuit and an interconnection point, and a control device configured to control the inverter as a voltage controlled inverter. The inverter outputs an output voltage superimposed with a harmonic to the interconnection point. The control device generates a first signal obtained by multiplying a signal of the harmonic to an output current measurement value of the inverter, generates a second signal by filtering the first signal, generates a third signal that is an absolute value of the second signal, generates a fourth signal by performing a lowpass filtering process on the third signal, and detects an islanding operation of the inverter based on the third signal and the fourth signal.

10 Claims, 9 Drawing Sheets

POWER CONVERTER AND ISLANDING OPERATION DETECTION METHOD

CROSS-REFERENCE TO RELATED APPLICATIONS

This application is based upon and claims priority to Japanese Patent Application No. 2023-223534, filed on Dec. 28, 2023, the entire contents of which are incorporated herein by reference.

FIELD

The present disclosure relates to power converters and islanding operation detection methods.

BACKGROUND

Conventionally, an islanding operation detection device that detects an islanding operation of distributed power sources is known from Japanese Laid-Open Patent Publication No. 2007-215392, and Japanese Laid-Open Patent Publication No. 2017-51063, for example.

Inverters capable of coordinating with a power grid include a current controlled inverter that controls input-output current on the AC side, and a voltage controlled inverter that controls an output voltage on the AC side. However, an islanding operation detector applied to the current controlled inverter cannot be applied to the voltage controlled inverter, such as a grid forming inverter (GFM inverter) or the like.

SUMMARY

Accordingly, it is an object in one aspect of the embodiments to provide a power converter and an islanding operation detection method capable of detecting an islanding operation of a voltage controlled inverter, such as the GEM inverter or the like.

According to one aspect of the embodiments, a power converter of a first aspect includes an inverter including an inverter circuit configured to convert a DC power into an AC power, and a reactor provided between the inverter circuit and an interconnection point; and a control device configured to control the inverter as a voltage controlled inverter, wherein the inverter outputs an output voltage superimposed with a harmonic to the interconnection point, and the control device generates a first signal obtained by multiplying a signal of the harmonic to an output current measurement value of the inverter, generates a second signal by filtering the first signal, generates a third signal that is an absolute value of the second signal, generates a fourth signal by performing a lowpass filtering process on the third signal, and detects an islanding operation of the inverter based on the third signal and the fourth signal.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1:
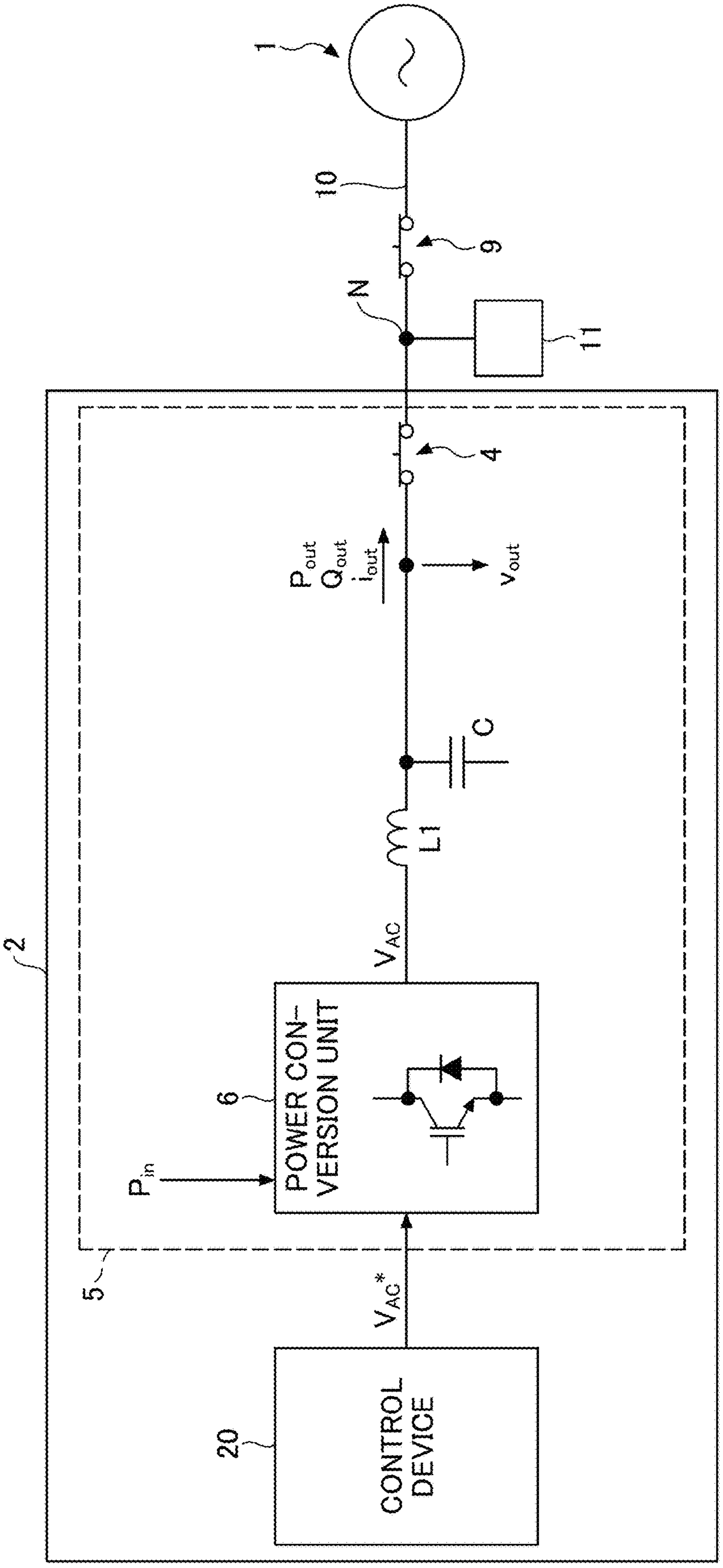
FIG. 1 is a functional block diagram illustrating a configuration example of a power converter according to a first embodiment.

[1] According to a first aspect of the present disclosure, a power converter includes an inverter including an inverter circuit configured to convert a DC power into an AC power, and a reactor provided between the inverter circuit and an interconnection point; and a control device configured to control the inverter as a voltage controlled inverter, wherein the inverter outputs an output voltage superimposed with a harmonic to the interconnection point, and the control device generates a first signal obtained by multiplying a signal of the harmonic to an output current measurement value of the inverter, generates a second signal by filtering the first signal, generates a third signal that is an absolute value of the second signal, generates a fourth signal by performing a lowpass filtering process on the third signal, and detects an islanding operation of the inverter based on the third signal and the fourth signal.

[2] According to a second aspect of the present disclosure, in the power converter according to [1] above, the control device may generate a fifth signal by multiplying a positive number less than 1 to the fourth signal, and detect the islanding operation of the inverter by comparing the third signal with the fifth signal.

[3] According to a third aspect of the present disclosure, in the power converter according to [2] above, the control device may determine that the inverter is in an islanding operation state in a case where the third signal is lower than the fifth signal.

[4] According to a fourth aspect of the present disclosure, in the power converter according to [2] or [3] above, the positive number may be greater than (maximum value of $Y_2$)/(maximum value of $Y_1$), where $Y_1$ denotes an admittance between the interconnection point and a power grid, and $Y_2$ denotes an admittance of a load connected to the interconnection point.

[5] According to a fifth aspect of the present disclosure, in the power converter according to any one of [1] to [4] above, the control device may generate the second signal from a moving average of the first signal.

[6] According to a sixth aspect of the present disclosure, in the power converter according to [5] above, a moving average time of a moving average filter that calculates the moving average of the first signal may be an integer multiple of a period of the signal of the harmonic or a time longer than the period of the signal of the harmonic.

[7] According to a seventh aspect of the present disclosure, in the power converter according to any one of [1] to [4] above, the control device may generate the second signal by performing a lowpass filtering process on the first signal.

[8] According to an eighth aspect of the present disclosure, in the power converter according to [7] above, a time constant of a lowpass filter that performs the lowpass filtering process on the first signal may be a time longer than the period of the signal of the harmonic.

[9] According to a ninth aspect of the present disclosure, in the power converter according to any one of [1] to [8] above, an amplitude of the harmonic superimposed on the output voltage may be smaller than a product of a reactance between the inverter circuit and the interconnection point and a harmonic current output limit value from the inverter circuit to the interconnection point.

[10] According to a tenth aspect of the present disclosure, an islanding operation detection method for a voltage controlled inverter including an inverter circuit configured to convert a DC power into an AC power, and a reactor provided between the inverter circuit and an interconnection point, includes causing the inverter to output an output voltage superimposed with a harmonic to the interconnection point; generating a first signal obtained by multiplying the signal of the harmonic to an output current measurement value of the inverter; generating a second signal by filtering the first signal; generating a third signal that is an absolute value of the second signal; generating a fourth signal by performing a lowpass filtering process on the third signal; and detecting an islanding operation of the inverter based on the third signal and the fourth signal.

Hereinafter, embodiments of the present disclosure will be described with reference to the drawings. In the drawings, the same constituent elements or components are designated by the same reference numerals, and a redundant description thereof may be omitted.

<Overall Schematic Configuration of Power Converter>

FIG. 1 is a diagram illustrating a configuration example of a power converter according to a first embodiment. A power converter 2 illustrated in FIG. 1 is interconnected to a power grid 1 at an interconnection point N. The power grid 1 is a power grid that supplies an AC power generated by a power plant to a load 11, such as a customer facility or the like, via a power distribution line 10.

The power converter 2 is a device that inputs the power to and outputs the power from the power grid 1. The power converter 2 includes an inverter 5 that inputs the power to and outputs the power from the power grid 1, and a control device 20 that operates the inverter 5 as a grid forming converter (GFM converter). Because the GEM inverter is required to function as a voltage source, the control device 20 controls the inverter 5 as a voltage controlled inverter.

The inverter 5 is a device that converts an input DC power into an AC power. The inverter 5 is an inverter based resource (IBR), for example, that converts the DC power generated from renewable energy, such as sunlight or the like, into the AC power, and operates in a state interconnected with the power grid 1. The inverter 5 includes a power conversion unit 6, a reactor L1, and a switch 4.

The power conversion unit 6 converts an input DC power $P_{in}$ (for example, the DC power generated from the renewable energy) into an AC power, according to a pulse width modulation signal (PWM pulse signal) $V_{AC}$* which is an example of a command value supplied from the control device 20. The power conversion unit 6 outputs a voltage $V_{AC}$ corresponding to an AC voltage, according to the PWM pulse signal $V_{AC}$*. The power conversion unit 6 is connected to the interconnection point N via the reactor L1, and is connected to the power grid 1 via the interconnection point N and the distribution line 10.

The reactor L1 is a passive device provided between the power conversion unit 6 and the interconnection point N. The reactor is also referred to as an inductor. The AC current output from the power conversion unit 6 via the reactor L1 flows to the interconnection point N as a current $i_{out}$. The voltage $V_{AC}$ output from the power conversion unit 6 is converted into a sinusoidal voltage, as an output voltage $v_{out}$ of the inverter 5, by the reactor L1 and a capacitor C. Further, the reactor L1 and the capacitor C restrict a flow of a high-frequency current to the power grid 1.

The reactor L1 is a component having a reactance. The reactor L1 may be a reactor included in a filter, a leakage reactance of a transformer, or both of such a reactor and a transformer. Further, the reactor L1 is not limited to these components.

The switch 4 is connected between the power grid 1 and the power conversion unit 6. The switch 4 may be referred to as an interconnection switch.

In a case where the power converter 2 assumes an islanding operation state, the control device 20 detects this islanding operation state, and stops the operation of the inverter 5 or releases the switch 4 to stop the islanding operation state.

Specifically, while the power converter 2 is interconnected with the power grid 1, the load 11 is supplied with the power from both the power grid 1 and the power converter 2. When a circuit breaker 9 inserted in series to the distribution line 10 is released due to a system fault or the like in a state where the power converter 2 is performing an interconnection operation, the power supply from the power grid 1 is stopped. If the power converter 2 continues the islanding operation in a state where the power supply from the power grid 1 is stopped, a voltage continues to be applied to the power grid connected to the load 11, and thus, a security hazard may occur during operation of the power grid. For this reason, the power converter 2 has a function of detecting the islanding operation disconnected from the power grid 1 and performing a predetermined operation, such as cutting off the power supply to the load 11 or the like. Details of the islanding operation detection will be described later.

The inverter 5 is controlled by the control device 20 according to a voltage control (GEM control), and is a device that operates as a virtual synchronous generator (VSG), for example.

The control device 20 controls the output voltage $v_{out}$ of the inverter 5, by controlling the voltage $V_{AC}$ output from the power conversion unit 6. The output voltage $v_{out}$ corresponds to a voltage at the interconnection point N connected to the distribution line 10. The control device 20 generates a command value (for example, the PWM pulse signal $V_{AC}$*) of the voltage $V_{AC}$ output by the power conversion unit 6, based on a measurement value of the output voltage $v_{out}$ at the interconnection point N and the output current $i_{out}$ flowing to the interconnection point N.

Functions of the control device 20 can be implemented by a processor, such as a central processing unit (CPU) or the like, which executes a program stored in a memory. The program may be stored in a non-transitory computer-readable storage medium, and the program which, when executed by a computer (or processor), may perform a process of the control device 20. The functions of the control device 20 can also be implemented by a field programmable gate array (FPGA) or an application specific integrated circuit (ASIC). Further, an analog circuit using an operational amplifier or the like may be used as a part of the control device 20.

Figure 2:
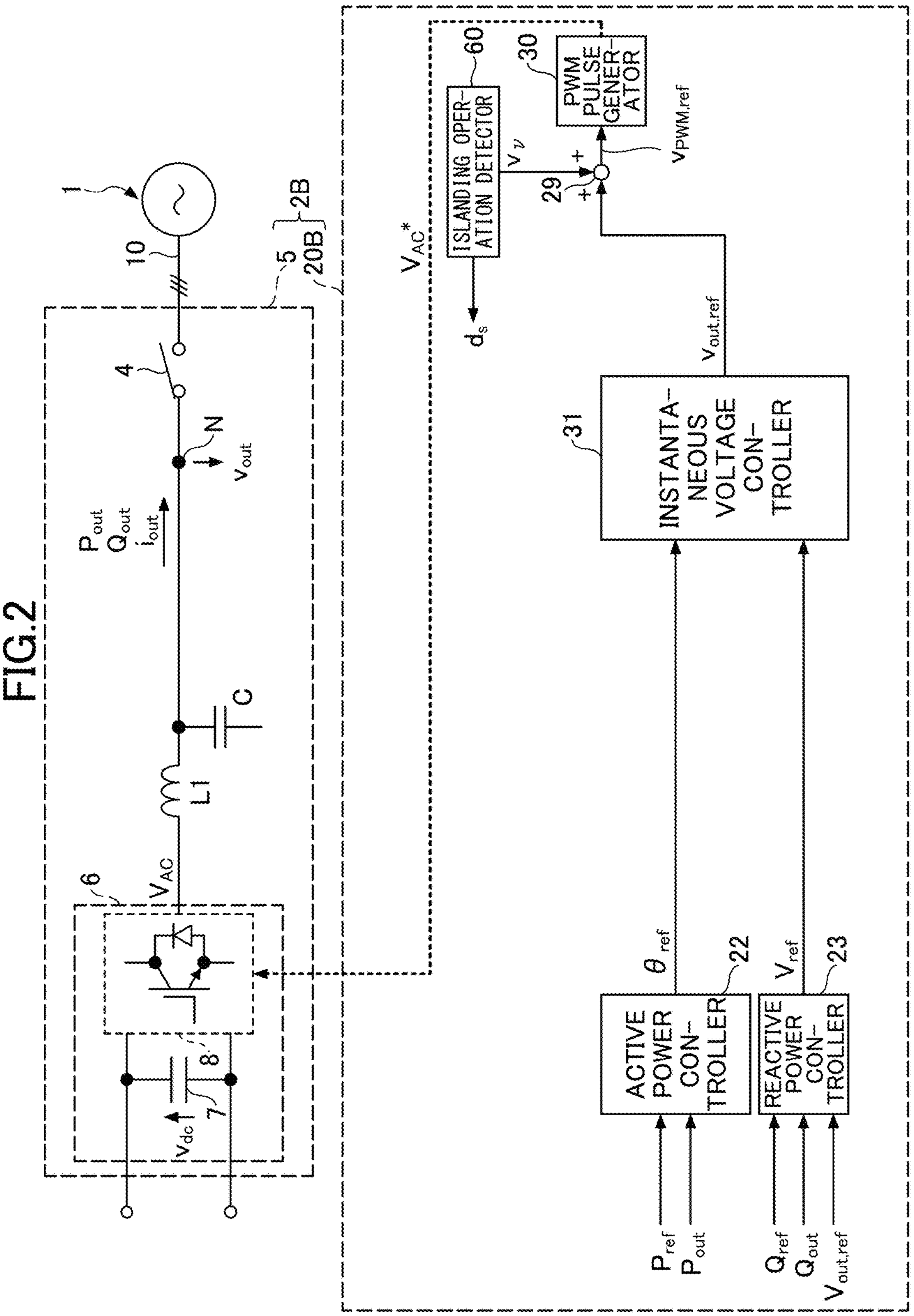
FIG. 2 is a diagram illustrating configuration examples of an inverter and a control device of the power converter according to the first embodiment.

FIG. 2 is a diagram illustrating configuration examples of the inverter and the control device of the power converter according to the first embodiment. FIG. 2 illustrates a circuit configuration of the inverter 5, and functional blocks of a control device 20B. A power converter 2B is an example of the power converter 2 described above. The power converter 2B includes the inverter 5 and the control device 20B.

The inverter 5 includes the power conversion unit 6, the reactor L1, the capacitor C, and the switch 4. The power conversion unit 6 includes a capacitor 7 and an inverter circuit 8.

The capacitor 7 smoothens a DC voltage input from an external device, such as a power generator that generates power using renewable energy, such as sunlight or the like. A DC voltage $v_{dc}$ corresponds to a voltage of the capacitor 7 (that is, a capacitor voltage).

The inverter circuit 8 is an inverter circuit that converts the DC power input from the external device, such as the power generator or the like, into the AC power. The inverter circuit 8 converts the DC voltage $V_{dc}$ smoothened by the capacitor 7 into the voltage $V_{AC}$ corresponding to an AC voltage, and outputs the voltage $V_{AC}$.

The control device 20B controls the inverter 5 according to the voltage control (GFM control). In this example, the control device 20B performs a virtual synchronous power generator control (VSG control) for controlling the inverter 5 so that the inverter 5 behaves like a synchronous power generator. For example, the control device 20B includes an active power controller 22, a reactive power controller 23, an instantaneous voltage controller 31, an adder 29, a PWM pulse generator 30, and an islanding operation detector 60.

[Active Power Controller]

The active power controller 22 generates a command value (a phase command value $\theta_{ref}$) of a phase θ of a three-phase output voltage $v_{out}$ to be output from the inverter 5 to the power grid 1, based on the VSG control. The phase command value $\theta_{ref}$ is a phase of an output voltage command value $v_{out,ref}$ generated by the instantaneous voltage controller 31. The output voltage command value $v_{out,ref}$ is a command value of the three-phase output voltage $v_{out}$ to be output from the inverter 5 to the power grid 1.

The active power controller 22 generates the phase command value $\theta_{ref}$ based on an active power command value $P_{ref}$ and an active power measurement value $P_{out}$, for example.

The active power command value $P_{ref}$ is a command value of an active power to be output from the inverter 5 to the power grid 1. The active power measurement value $P_{out}$ is a measurement value of the active power actually output from the inverter 5 to the power grid 1. The active power measurement value $P_{out}$ is a measurement value at the interconnection point N between the reactor L1 and the power grid 1.

Figure 3:
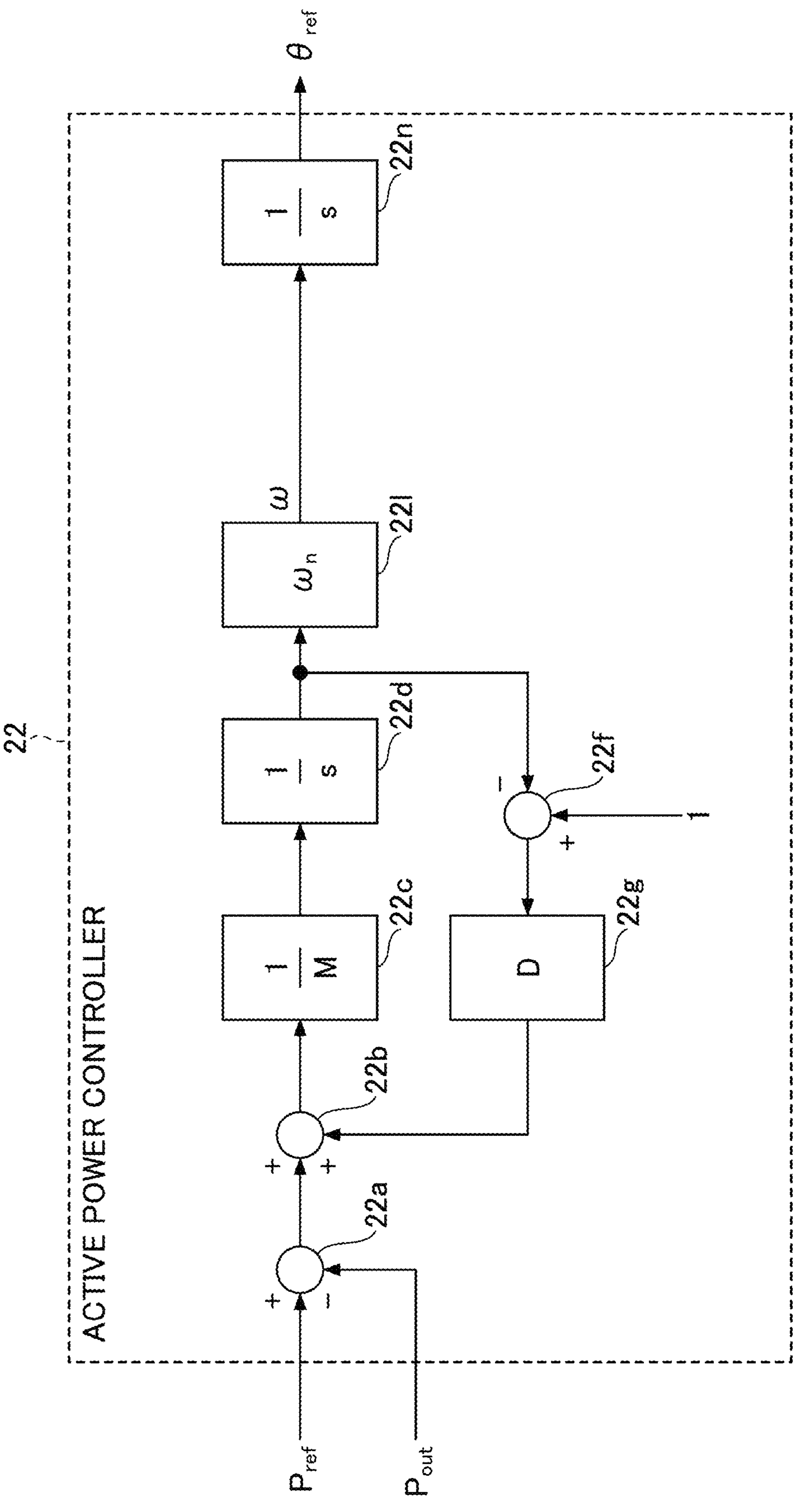
FIG. 3 is a functional block diagram illustrating an example of an active power controller of the control device.

FIG. 3 is a functional block diagram illustrating an example of the active power controller of the control device. The active power controller 22 includes adders 22*a*, 22*b*, and 22*f*, multipliers 22*c*, 22*g*, and 22*l*, and integrators 22*d* and 22*n*.

In the following description, M denotes an inertia constant and D denotes a braking constant when the inverter 5 operates as the virtual synchronous generator.

The adder 22*a* outputs a value ($P_{ref}$-$P_{out}$), obtained by subtracting the active power measurement value $P_{out}$ from the active power command value $P_{ref}$, to the adder 22*b*.

The adder 22*b* outputs a value, obtained by adding an input from the multiplier 22*e* to the input value ($P_{ref}$-$P_{out}$) from the adder 22*a*, to the multiplier 22*c*.

The multiplier 22*c* outputs a value, obtained by multiplying 1/M to the input value from the adder 22*b*, to the integrator 22*d*.

The integrator 22*d* outputs a result, obtained by integrating the input value from the multiplier 22*c*, to the multiplier 22*l*.

The value obtained by the integration (or the value output from the integrator 22*d*) is a value obtained by integrating a frequency ω of the output voltages $v_{out}$ of the inverter 5 by a nominal frequency $\omega_n$ of the power grid 1. In Japan, for example, the nominal frequency $\omega_n$ is a value obtained by multiplying 2π to 50 Hz in eastern Japan, and is a value obtained by multiplying 2π to 60 Hz in western Japan.

The adder 22*f* outputs a value, obtained by subtracting the input value from the integrator 22*d* from 1, to the multiplier 22*g*. The input value to the adder 22*f* may be a value obtained by dividing the frequency ω of the output voltage $v_{out}$ measured at the interconnection node N by the nominal frequency $\omega_n$, instead of using the input value from the integrator 22*d*.

The multiplier 22*g* outputs a value, obtained by multiplying the braking constant D of the virtual synchronous generator (VSG) (in this example, the braking constant D of the inverter 5 which operates as the VSG) to the input value from the adder 22*f*, to the adder 22*b*.

The multiplier 22*l* outputs a value obtained by multiplying the nominal frequency on to the input value from the integrator 22*d*. The output value of the multiplier 22*l* corresponds to a command value of the frequency of the output voltage $v_{out}$ (that is, the frequency of the voltage $V_{AC}$ output from the inverter circuit 8) to be output from the inverter 5 to the power grid 1.

The integrator 22*n* integrates the input value from the multiplier 22*l*, and outputs the phase command value $\theta_{ref}$ as an integration result.

[Reactive Power Controller]

In FIG. 2, the reactive power controller 23 generates a command value (an amplitude command value $V_{ref}$) of an amplitude V of the three-phase output voltage $v_{out}$ to be output from the inverter 5 to the power grid 1. The amplitude command value $V_{ref}$ is an amplitude of the output voltage command value $v_{out,ref}$ generated by the instantaneous voltage controller 31.

The reactive power controller 23 generates the amplitude command value $V_{ref}$, based on a reactive power command value $Q_{ref}$, a reactive power measurement value $Q_{out}$, and the output voltage amplitude command value $V_{out,ref}$, for example.

The reactive power command value $Q_{ref}$ is a command value of a reactive power to be output from the inverter 5 to the power grid 1. The reactive power measurement value $Q_{out}$ is a measurement value of the reactive power actually output from the inverter 5 to the power grid 1. The reactive power measurement value $Q_{out}$ is a measurement value at the interconnection point N between the reactor L1 and the power grid 1.

The output voltage amplitude command value $V_{out,ref}$ is a command value of an amplitude of the output voltage $v_{out}$ to be output from the inverter 5 to the power grid 1.

Figure 4:
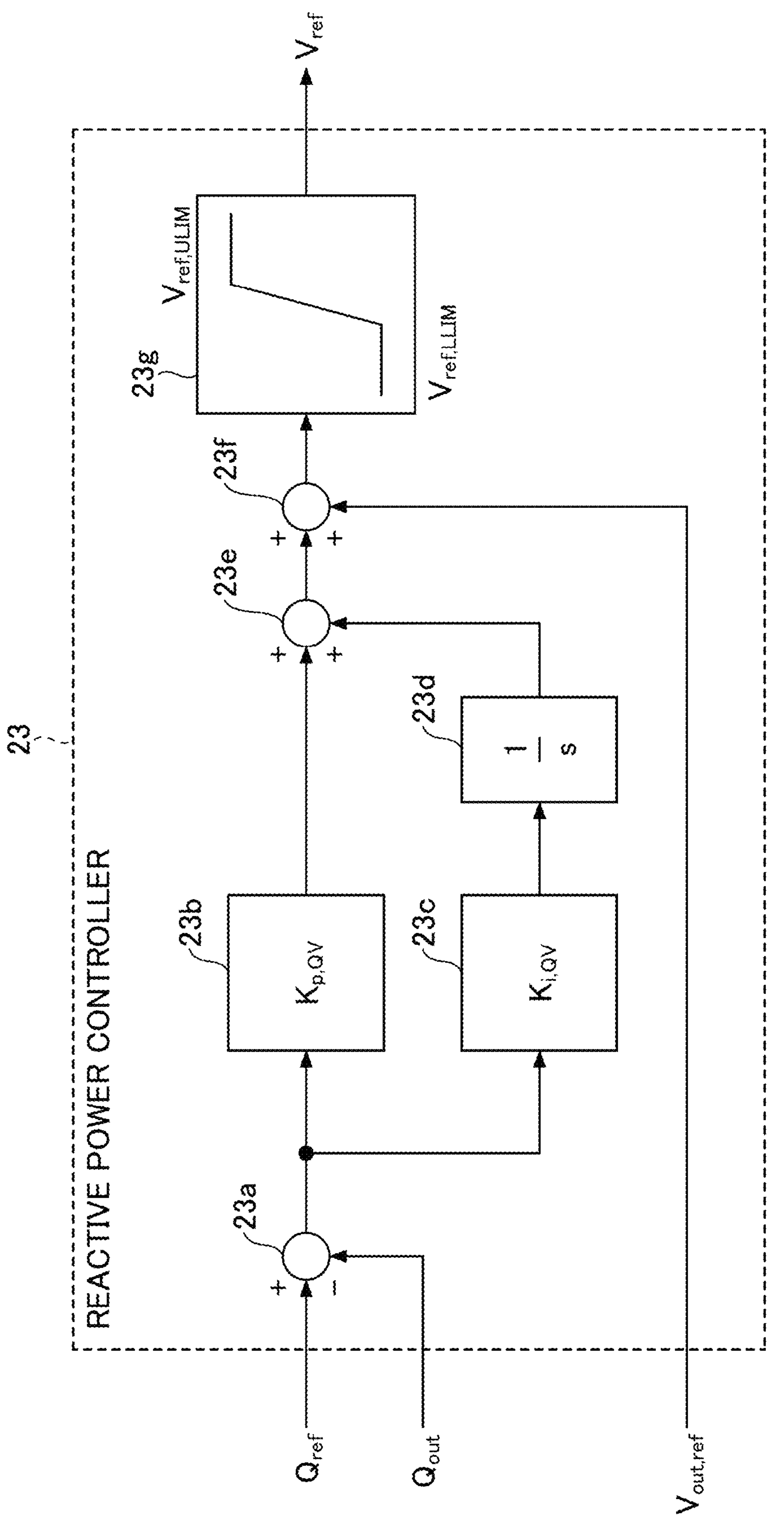
FIG. 4 is a functional block diagram illustrating an example of a reactive power controller of the control device.

FIG. 4 is a functional block diagram illustrating an example of the reactive power controller of the control device. The reactive power controller 23 includes adders 23*a*, 23*e*, and 23*f*, multipliers 23*b* and 23*c*, an integrator 23*d*, and a limiter 23*g*

The adder 23*a* outputs a value, obtained by subtracting the reactive power measurement value $Q_{out}$ from the reactive power command value $Q_{ref}$, to the multiplier 23*b* and the multiplier 23*c*.

The multiplier 23*b* outputs a value, obtained by multiplying a gain $K_{p,QV}$ to an input value from the adder 23*a*, to the adder 23*e*. The gain $K_{p,QV}$ is a parameter for performing a proportional control so as to minimize a difference between the reactive power measurement value $Q_{out}$ and the reactive power command value $Q_{ref}$. The gain $K_{p,QV}$ is a proportional gain of a proportional integral controller (PI controller) for Q-V droop control, for example.

The multiplier 23*c* outputs a value, obtained by multiplying a gain $K_{i,QV}$ to the input value from the adder 23*a*, to the integrator 23*d*. The gain $K_{i,QV}$ is a parameter for performing an integral control so as to minimize the difference between the reactive power measurement value $Q_{out}$ and the reactive power command value $Q_{ref}$. The gain $K_{i,QV}$ is an integral gain of a proportional integral controller (PI controller) for Q-V droop control, for example.

The integrator 23*d* outputs a result of a time integration of an input value from the multiplier 23*c* to the adder 23*e*.

The adder 23*e* outputs a value, obtained by adding an input value from the multiplier 23*b* and an input value from the integrator 23*d*, to the adder 23*f*.

The adder 23*f* outputs a value, obtained by adding an input value from the adder 23*e* and the amplitude command value $V_{out,ref}$ of the output voltage $v_{out}$, to the limiter 23*g*.

The limiter 23*g* limits an input value from the adder 23*f*, based on an upper limit value and a lower limit value that are set, and outputs the limited value as the amplitude command value $V_{ref}$.

The limiter 23*g* outputs the input value from the adder 23*f* as it is when the input value from the adder 23*f* is greater than or equal to a lower limit value $V_{ref,LLIM}$ and is less than or equal to an upper limit value $V_{ref,ULIM}$.

The limiter 23*g* outputs the upper limit value $V_{ref,ULIM}$ when the input value from the adder 23*f* is greater than the upper limit value $V_{ref,ULIM}$. The limiter 23*g* outputs the lower limit value $V_{ref,LLIM}$ when the input value from the adder 23*f* is less than the lower limit value $V_{ref,LLIM}$.

The output value of the limiter 23*g* corresponds to a command value (a voltage command value $V_{ref}$) of the amplitude V of the three-phase output voltage $v_{out}$ to be output from the inverter 5 to the power grid 1.

[Instantaneous Voltage Controller]

In FIG. 2, the instantaneous voltage controller 31 derives the output voltage command value $v_{out,ref}$, which is the command value of the three-phase output voltage $v_{out}$ to be output from the inverter 5 to the power grid 1, based on the amplitude command value $V_{ref}$ and the phase command value $\theta_{ref}$. The output voltage command value $v_{out,ref}$ is a command value of a three-phase instantaneous voltage to be output from the inverter 5 to the power grid 1.

Figure 5:
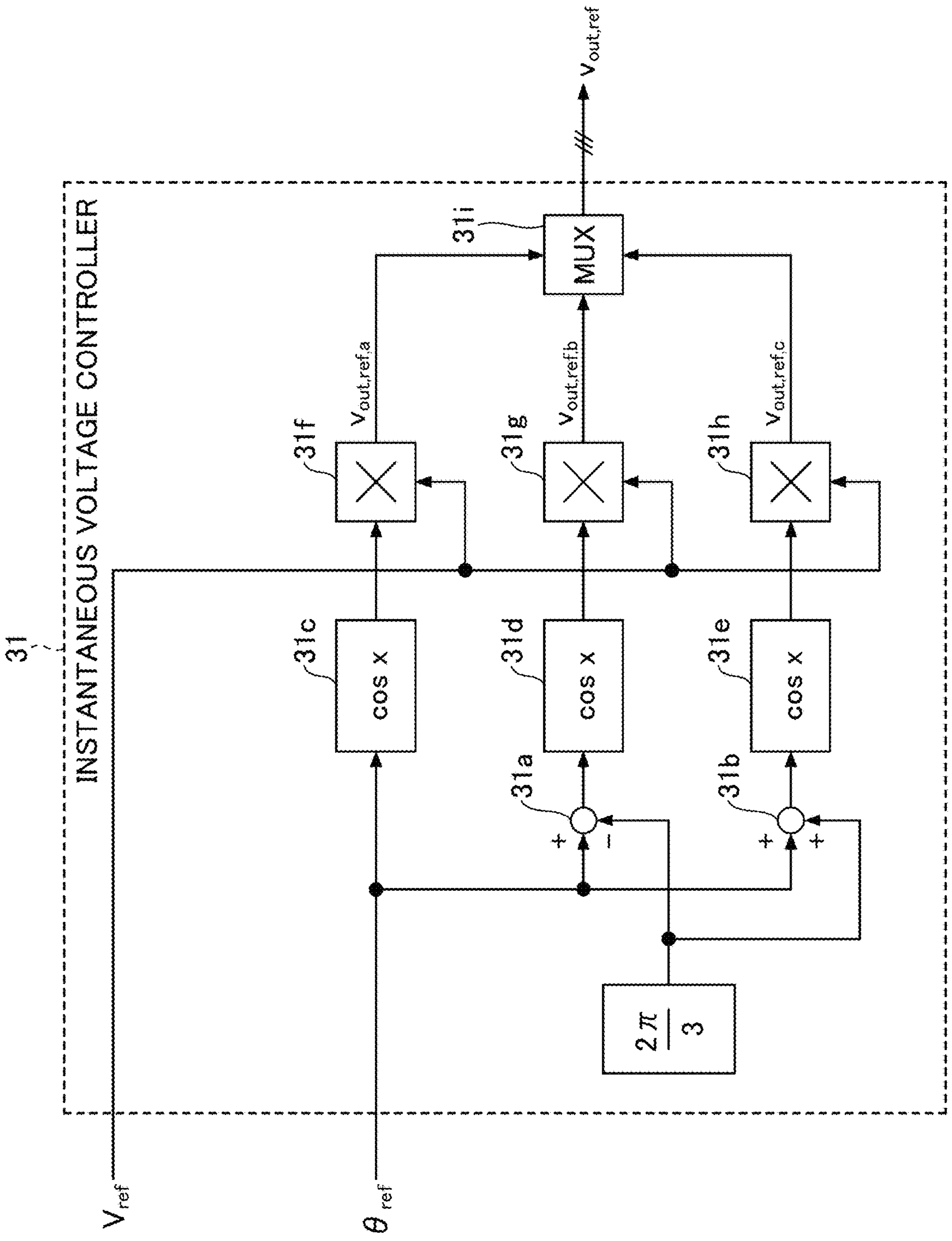
FIG. 5 is a functional block diagram illustrating an example of an instantaneous voltage controller of the control device.

FIG. 5 is a functional block diagram illustrating an example of the instantaneous voltage controller of the control device. The instantaneous voltage controller 31 includes adders 31*a* and 31*b*, cosine function generators 31*c*, 31*d*, and 31*e*, multipliers 31*f*, 31*g*, and 31*h*, and a multiplexer 31*i*.

The adder 31*a* outputs a value $(\theta_{ref}-(2\pi/3))$, obtained by subtracting $(2\pi/3)$ from the phase angle command value $\theta_{ref}$, to the cosine function generator 31*d*.

The adder 31*b* outputs a value $(\theta_{ref}+(2\pi/3))$, obtained by adding the phase angle command value $\theta_{ref}$ and $(2\pi/3)$, to the cosine function generator 31*e*.

The multiplier 31*f* multiplies the amplitude command value $V_{ref}$ to an input value $\cos(\theta_{ref})$ from the cosine function generator 31*c*, and outputs the multiplied value as an output voltage command value $V_{out,ref,a}$ of an A-phase.

The multiplier 31*g* multiplies the amplitude command value $V_{ref}$ to an input value $\cos(\theta_{ref}-(2\pi/3))$ from the cosine function generator 31*d*, and outputs the multiplied value as an output voltage command value $V_{out,ref,b}$ of a B-phase.

The multiplier 31*h* multiplies the amplitude command value $V_{ref}$ to an input value $\cos(\theta_{ref}+(2\pi/3))$ from the cosine function generator 31*e*, and outputs the multiplied value as an output voltage command value $v_{out,ref,c}$ of a C-phase.

The multiplexer 31*i* combines (or multiplexes) the output voltage command values $v_{out,ref,a}$, $v_{out,ref,b}$, and $v_{out,ref,c}$ of the respective phases into one signal, and outputs the output voltage command value $v_{out,ref}$ of the three-phase output voltage $v_{ref}$ to be output from the inverter 5 to the power grid 1. In this example, the three signals are combined into one signal by the multiplexer 31*i* in order to facilitate processing of the three signals, but the three signals may be sent to the next stage (or block) as three separate signals without using the multiplexer 31*i*.

[Adder]

In FIG. 2, the adder 29 outputs a value, obtained by adding a harmonic $v_\nu$ to the output voltage command value $v_{out,ref}$, as a PWM command value $v_{PWM,ref}$. The harmonic $v_\nu$ is a harmonic of a signal generated by the islanding operation detector 60 which will be described later.

[PWM Pulse Generator]

In FIG. 2, the PWM pulse generator 30 compares the PWM command value $v_{PWM,ref}$ with a carrier signal, such as a triangular wave or the like, and generates the PWM pulse signal $V_{AC}$* including PWM pulses. The pulse width modulation method is not limited to a triangular wave comparison modulation (or a triangular carrier modulation), and a generally used pulse width modulation can be utilized. In addition, it is of course necessary to generate a required number of PWM pulses depending on the configuration of the inverter circuit 8.

[Islanding Operation Detector]

In FIG. 2, the islanding operation detector 60 is configured to detect the islanding operation of the inverter 5. The islanding operation detector 60 generates the harmonic $v_\nu$ for detecting the islanding operation of the inverter 5 (or the power converter 2), and outputs a detection result (or a determination result $d_s$) of the islanding operation. In a case where the islanding operation of the inverter 5 is detected by the islanding operation detector 60, the control device 20B takes measures, such as canceling the islanding operation of the inverter 5 (or the power converter 2) by releasing the switch 4 or stopping the inverter 5, for example.

Figure 6:
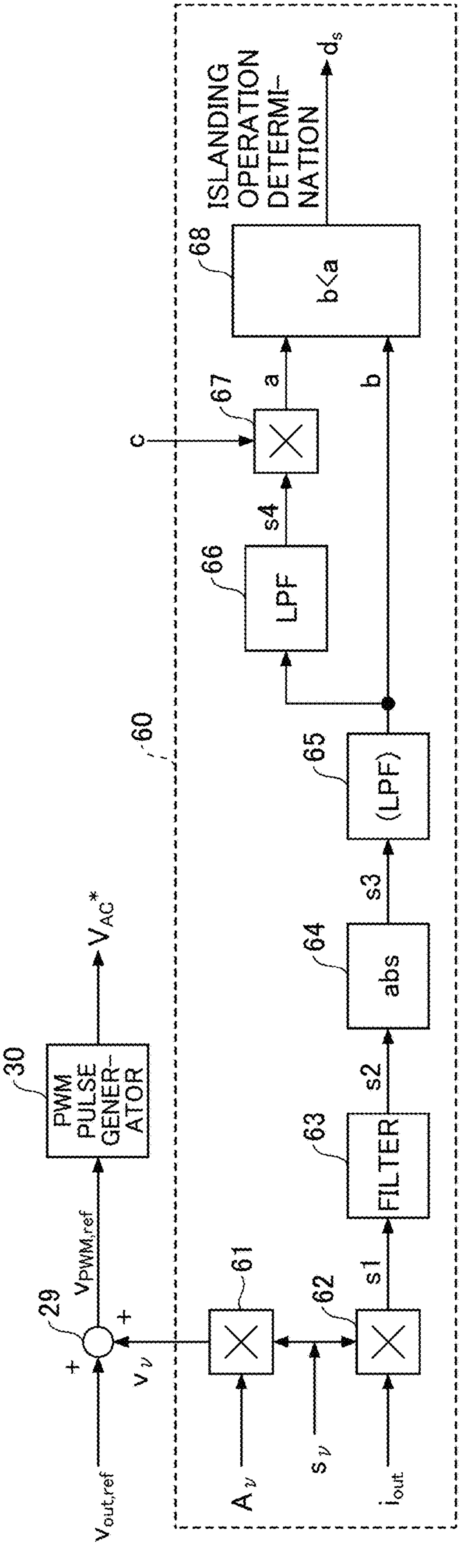
FIG. 6 is a functional block diagram illustrating an example of an islanding operation detector of the control device.

FIG. 6 is a functional block diagram illustrating an example of the islanding operation detector of the control device. The islanding operation detector 60 illustrated in FIG. 6 includes multipliers 61, 62, and 67, a filter 63, an absolute value (abs) function generator 64, lowpass filters 65 and 66, and a determination unit 68. The lowpass filter 65 may be omitted.

The multiplier 61 multiplies an amplitude $A_\nu$ to a ν-th harmonic signal $s_\nu$ having an amplitude of 1, to generate a ν-th harmonic $V_\nu$ having the amplitude $A_\nu$, and outputs the ν-th harmonic $V_\nu$ to the adder 29. ν is a number greater than 1 (excluding multiples of 3), and is preferably a non-integer in order to improve an islanding operation detection accuracy. The ν-th harmonic signal $s_\nu$ is a signal having a frequency that is ν times a rated frequency (for example, 50 Hz or 60 Hz) of the power grid 1.

Figure 7:
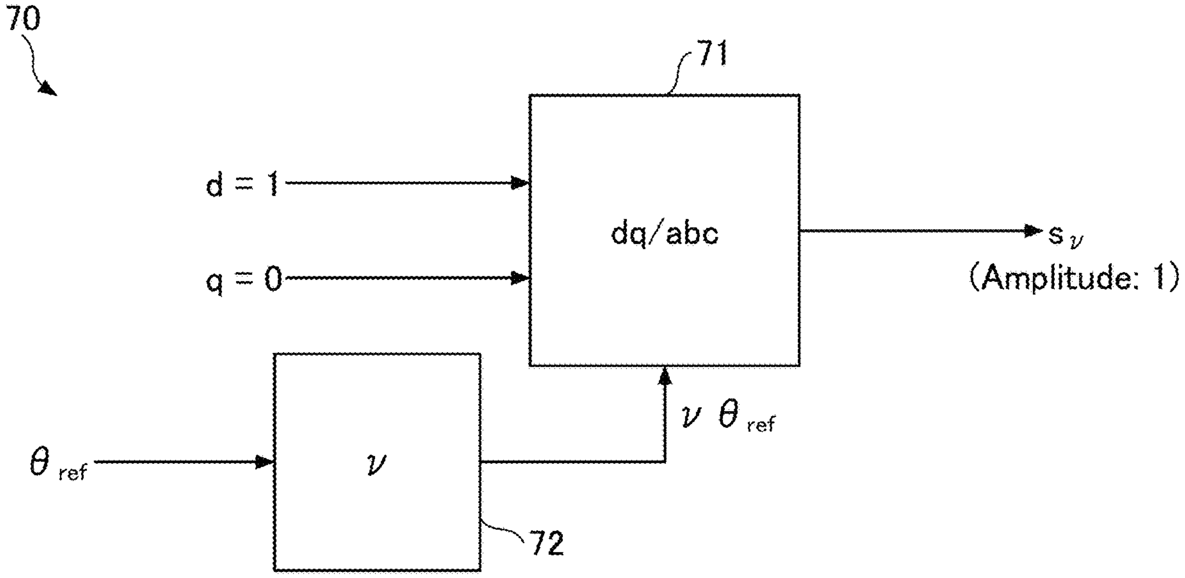
FIG. 7 is a functional block diagram illustrating an example of a harmonic generator of the control device.

FIG. 7 is a functional block diagram illustrating an example of the harmonic generator of the control device.

The harmonic generator 70 generates the ν-th harmonic signal $s_\nu$ having the amplitude of 1. The harmonic generator 70 includes a dq/abc converter 71 and a multiplier 72. The dq/abc converter 71 converts binary values d and q of a dq rotating coordinate system into a three-phase abc signal (the ν-th harmonic signal $s_\nu$), using an inverse Park transformation. The multiplier 72 multiplies ν to the phase command value $\theta_{ref}$ to generate an angular position $\nu\theta_{ref}$ in the dq rotating coordinate system, and outputs the angular position $\nu\theta_{ref}$ to the dq/abc converter 71. The dq/abc converter 71 may have the same configuration as the instantaneous voltage controller 31 illustrated in FIG. 5.

In FIG. 6, the adder 29 generates the PWM command value $v_{PWM,ref}$ having the ν-th harmonic $v_\nu$ superimposed on the output voltage command value $v_{out,ref}$. The output voltage command value $v_{out,ref}$ is a command value of the three-phase output voltage $v_{ref}$ to be output from the inverter 5 to the power grid 1. Because the PWM command value $v_{PWM,ref}$ having the ν-th harmonic $v_\nu$ superimposed on the output voltage command value $v_{out,ref}$ is generated, the inverter 5 outputs the output voltage $v_{out}$ superimposed with the harmonic $v_\nu$ to the interconnection point N.

On the other hand, the multiplier 62 generates the first signal s1 by multiplying the output current measurement value $i_{out}$ to the first harmonic signal $s_\nu$, and outputs the first signal s1 to the filter 63. The output current measurement value $i_{out}$ is a measurement value of a three-phase output current output from the inverter 5 to the power grid 1. Although the multiplier 62 generates the first signal s1 for three phases, the multiplier 62 may generate the first signal s1 for only one phase.

Because the ν-th harmonic $v_\nu$ is superimposed on the output voltage command value $v_{out,ref}$ in the adder 29, the ν-th component is mixed to the output current measurement value $i_{out}$. The islanding operation detector 60 detects the islanding operation of the inverter 5 by evaluating an amplitude of the ν-th order component mixed to the output current measurement value $i_{out}$.

The filter 63 generates a second signal s2 by filtering the first signal s1. The filter 63 extracts the ν-th order component included in the measured current value $i_{out}$ by performing a filtering process corresponding to a Fourier series expansion process on the first signal s1.

The filter 63 is a moving average filter that computes a moving average of the first signal s1, for example. A moving average time of the moving average filter is set to an integral multiple of the period of the ν-th harmonic signal $s_\nu$, or to a time that is sufficiently long compared to the period of the ν-th harmonic signal $s_\nu$, for example. The moving average time of the moving average filter is set to a time that is sufficiently short compared to a predetermined single operation detection time limit. By using the moving average filter as the filter 63, it is possible to extract a detection signal "b" in which pulsation of the ν-th order component is suppressed. The detection signal "b" will be described later.

The filter 63 may be a lowpass filter that performs a lowpass filtering process on the first signal s1 to generate the second signal s2 in which the high-frequency components of the first signal s1 are attenuated more than the low-frequency components of the first signal s1. In the case of the lowpass filter, a time constant thereof is set to a time that is sufficiently long compared to the period of the ν-th harmonic signal $s_\nu$, for example. The time constant of the lowpass filter is set to a time that is sufficiently short compared to the predetermined single operation detection time limit. By using the lowpass filter for the filter 63, the detection signal "b", which will be described later, in which the pulsation of the ν-th order component is suppressed, can be extracted.

The abs function generator 64 is an absolute value computing unit that generates a third signal s3 that is an absolute value of the second signal s2. The absolute value of the second signal s2 is computed because the second signal s2 may have a negative value.

The lowpass filter 65 performs the lowpass filtering process on the third signal s3, to output the third signal s3 in which the high-frequency components are attenuated more than the low-frequency components, as the detection signal "b". In a case where the lowpass filter 65 is not provided, the detection signal "b" may be the same as the third signal s3.

The lowpass filter 66 generates a fourth signal s4 by performing a lowpass filtering process on the detection signal "b". A time constant of the lowpass filter 66 is set to a time that is longer than the predetermined single operation detection time limit, for example.

The multiplier 67 generates a fifth signal "a" by multiplying a positive number c less than 1 to the fourth signal s4.

The determination unit 68 compares the detection signal "b" with the fifth signal "a" to determine (or detect) the islanding operation of the inverter 5. When the inverter 5 assumes the islanding state, a phenomenon occurs in which a harmonic admittance on an output side of the inverter 5 decreases. The determination unit 68 determines (or detects) the islanding operation of the inverter 5 by comparing the fifth signal "b" (or the third signal s3 in the case where the lowpass filter 65 is not provided) with the fifth signal "a" by utilizing this phenomenon.

As described above, the power converter 2 according to the first embodiment (that is, the islanding operation detection method performed by the islanding operation detector 60 of the control device 20B) can detect the islanding operation of the inverter 5 (or the power converter 2).

In the case where the islanding operation of the inverter 5 is detected by the islanding operation detector 60, the control device 20B takes measures, such as canceling the islanding operation of the inverter 5 (or the power converter 2) by releasing the switch 4 or stopping the inverter 5, for example.

Figure 8:
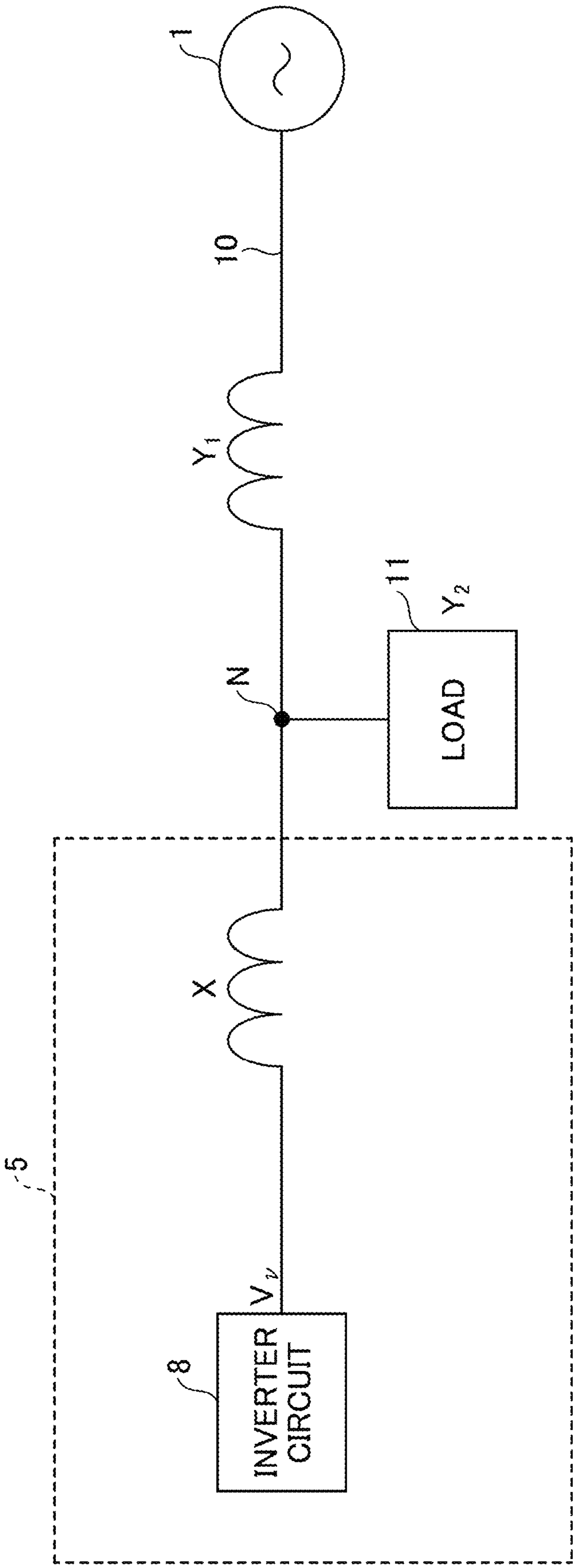
FIG. 8 is a model diagram schematically illustrating an example of a power system including a power converter and a load connected to a power grid.

FIG. 8 is a model diagram schematically illustrating an example of a power system including the power converter and the load connected to the power grid.

The amplitude $A_\nu$ of the harmonic $v_\nu$ superimposed on the output voltage command value $v_{out,ref}$ is set to a value that is smaller than a product of a "reactance X related to the ν-th order component" between the inverter circuit 8 and the interconnection point N, and a harmonic current output limit value $I_{max}$ from the inverter circuit 8 to the interconnection point N, for example. Thus, while the inverter 5 is interconnected with the power grid 1, the ν-th harmonic current flowing out to the power grid 1 can be maintained less than or equal to the harmonic current output limit value $I_{max}$.

The positive number c less than 1 illustrated in FIG. 6 is set to a value that is greater than a ratio of a maximum value of an admittance $Y_2$ of the load 11 possible in the islanding state with respect to a ν-th component, to a minimum value of an admittance $Y_1$ of the distribution line 10 possible while the inverter 5 is interconnected with the power grid 1, for example. Thus, it is possible to prevent a detection failure, such as a failure to detect the islanding operation or the like.

More specifically, in FIG. 8, the admittance $Y_1$ represents the admittance of the distribution line 10 between the interconnection point N and the power grid 1. The admittance $Y_2$ represents the admittance of the load 11 connected to the interconnection point N. The voltage $V_v$ represents a harmonic voltage superimposed on the output voltage of the inverter circuit 8. While the inverter 5 is interconnected with the power grid 1, a harmonic current $(Y_1V_v)$ flowing out from the inverter circuit 8 mainly flows toward the power grid 1. When the inverter 5 shifts to the islanding operation state, a harmonic current $(Y_2V_v)$ flowing out from the inverter circuit 8 flows only to the load 11, and an amplitude of the harmonic current $(Y_2V_v)$ is approximately $(Y_2/Y_1)$ with respect to the amplitude during the interconnection. For this reason, by setting the positive number c less than 1 to a value greater than the ratio (maximum value of $Y_2$)/(maximum value of $Y_1$), it is possible to prevent a detection failure, such as a failure to detect the islanding operation of the inverter 5 or the like, after the inverter 5 shifts to the islanding operation state.

Figure 9:
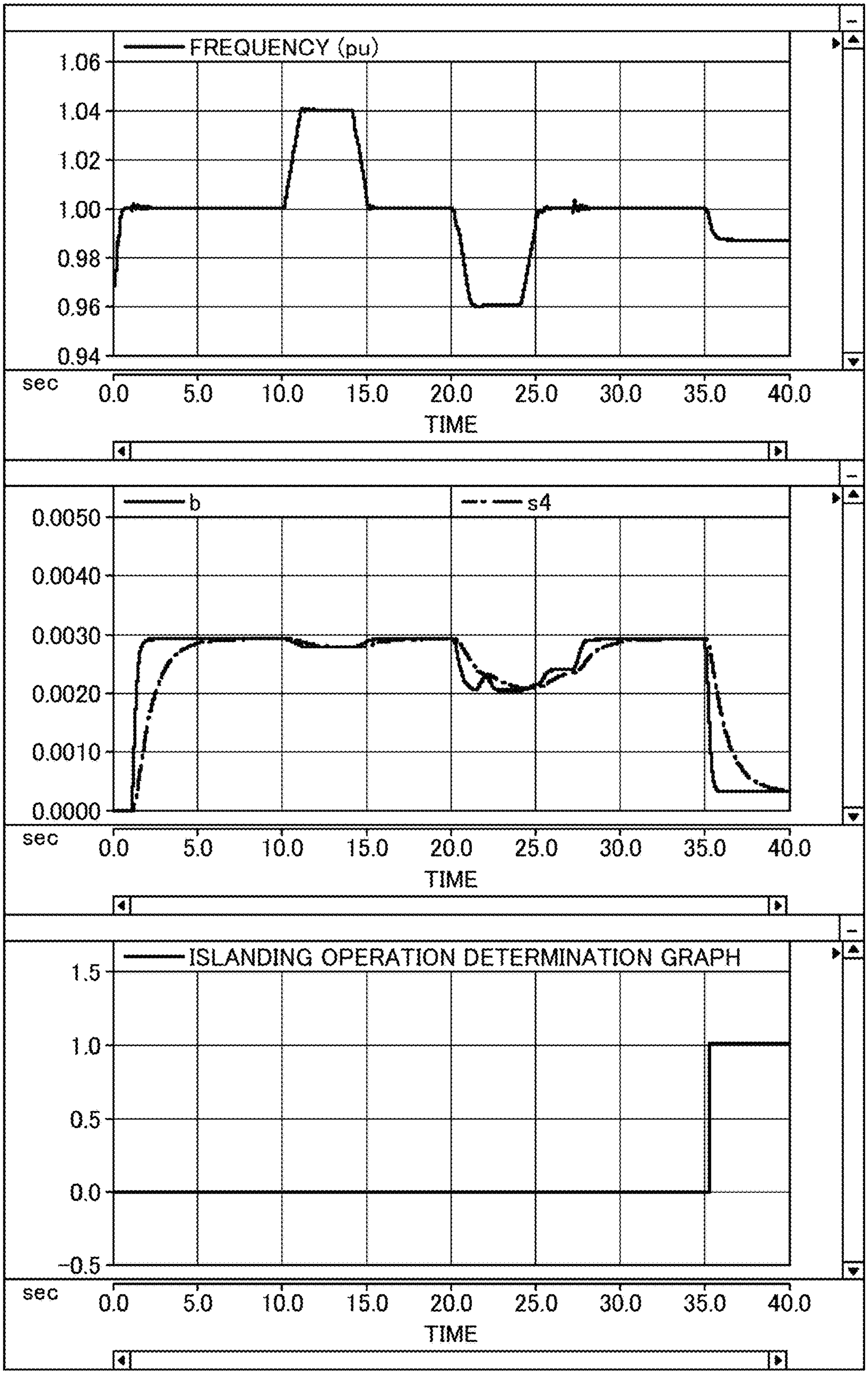
FIG. 9 is a diagram illustrating an example of simulation results of the islanding operation detection method.

FIG. 9 is a diagram illustrating an example of simulation results of the islanding operation detection method. FIG. 9 illustrates a simulation using a model in which the inverter 5 controlled by the GEM control is connected to an infinite bus. Simulation condition values are expressed in per unit (PU) values obtained by setting the nominal frequency to 50 Hz and the line voltage to 6.6 kV, and normalizing a reference capacitance by 60 MVA. As illustrated in FIG. 8, a bus voltage of the power grid 1 during the interconnection is set to 1.0 pu, a reactance of the line between the interconnection point N and the power grid 1 is set to 0.1 pu, and a resistance of the line between the interconnection point N and the power grid 1 is set to 0.01 pu. The output of the inverter circuit 8 is set to 1.0+j0, and the load 11 is set to a capacitive load of 1.0−j0. The reactance X between the inverter circuit 8 and the interconnection point N is set to j0.13 pu.

In FIG. 9, the frequency of the power grid 1 is first set to 50 Hz, the inverter 5 is interconnected with the power grid 1 at a time of 1.0 s, and the output of the inverter 5 is started. The frequency of the power grid 1 is increased from a time of 10 s to 52 Hz at 2 Hz/s, and returned from a time of 14 s to 50 Hz at −2 Hz/s. Thereafter, the frequency of the power grid 1 is decreased from a time of 20 s to 48 Hz at −2 Hz/s, and returned at a time of 24 s to 50 Hz at 2 Hz/s. The frequency of the power grid 1 is varied in this manner in order to confirm that no erroneous detection of the islanding operation state occurs even when the system frequency of the power grid 1 varies. From a time of 25 s, the interconnection point N and the power grid 1 are disconnected to shift the inverter 5 to the islanding operation state.

ν is set to 2.8, and the positive number c is set to 0.4. The time constant of the lowpass filter 66 is set to 1.0 s.

After shifting to the islanding operation state, the detection signal "b" rapidly decreases. In contrast, the fifth signal "a" (=fourth signal s4×positive number c) is generated by the configuration illustrated in FIG. 6, and thus decreases more gradually than the detection signal "b". The islanding operation detector 60 detects islanding operation of the inverter 5 by comparing the detection signal "b" with the fifth signal "a" (=fourth signal s4×positive number c). In a case where the detection signal "b" is detected as being lower than the fifth signal "a", the islanding operation detector 60 determines that the inverter 5 is in the islanding operation state, and asserts a determination flag thereof. The time constant of the lowpass filter 66 is set to a time longer than the islanding operation detection time limit, so as to prevent a sudden change in the fifth signal "a" during the determination, and prevent the erroneous determination of the islanding operation.

The embodiments are described above, but the embodiments are presented as examples, and the present invention is not limited to the embodiments. The above described embodiments can be implemented in various other forms, and various combinations, omissions, substitutions, modifications, or the like can be made without departing from the scope spirit of the present invention. The embodiments, modifications, and equivalents thereof are included in the scope and spirit of the present invention.

For example, the amplitude command value $V_{ref}$ is not limited to being generated by the reactive power controller as in the embodiment described above, and may be generated through another control, such as a constant voltage control in which the amplitude command value $V_{ref}$ is set to a constant value, for example.

According to the disclosed technique, it is possible to provide a power converter and an islanding operation detection method capable of detecting an islanding operation of a voltage controlled inverter, such as the GEM inverter or the like.

What is claimed is:

1. A power converter comprising:

an inverter including an inverter circuit configured to convert a DC power into an AC power, and a reactor provided between the inverter circuit and an interconnection point; and a control device configured to control the inverter as a voltage controlled inverter, wherein:

the inverter outputs an output voltage superimposed with a harmonic to the interconnection point, and the control device generates a first signal obtained by multiplying a signal of the harmonic to an output current measurement value of the inverter, generates a second signal by filtering the first signal, generates a third signal that is an absolute value of the second signal, generates a fourth signal by performing a lowpass filtering process on the third signal, and detects an islanding operation of the inverter based on the third signal and the fourth signal.

2. The power converter as claimed in claim 1, wherein the control device generates a fifth signal by multiplying a positive number less than 1 to the fourth signal, and detects the islanding operation of the inverter by comparing the third signal with the fifth signal.

3. The power converter as claimed in claim 2, wherein the control device determines that the inverter is in an islanding operation state in a case where the third signal is lower than the fifth signal.

4. The power converter as claimed in claim 2, wherein the positive number is greater than (maximum value of $Y_2$)/(maximum value of $Y_1$), where $Y_1$ denotes an admittance between the interconnection point and a power grid, and $Y_2$ denotes an admittance of a load connected to the interconnection point.

5. The power converter as claimed in claim 1, wherein the control device generates the second signal from a moving average of the first signal.

6. The power converter as claimed in claim 5, wherein a moving average time of a moving average filter that calculates the moving average of the first signal is an integer multiple of a period of the signal of the harmonic or a time longer than the period of the signal of the harmonic.

7. The power converter as claimed in claim 1, wherein the control device generates the second signal by performing a lowpass filtering process on the first signal.

8. The power converter as claimed in claim 7, wherein a time constant of a lowpass filter that performs the lowpass filtering process on the first signal is a time longer than the period of the signal of the harmonic.

9. The power converter as claimed in claim 1, wherein an amplitude of the harmonic superimposed on the output voltage is smaller than a product of a reactance between the inverter circuit and the interconnection point and a harmonic current output limit value from the inverter circuit to the interconnection point.

10. An islanding operation detection method for a voltage controlled inverter including an inverter circuit configured to convert a DC power into an AC power, and a reactor provided between the inverter circuit and an interconnection point, the islanding operation detection method comprising:

causing the inverter to output an output voltage superimposed with a harmonic to the interconnection point;

generating a first signal obtained by multiplying a signal of the harmonic to an output current measurement value of the inverter;

generating a second signal by filtering the first signal;

generating a third signal that is an absolute value of the second signal;

generating a fourth signal by performing a lowpass filtering process on the third signal; and detecting an islanding operation of the inverter based on the third signal and the fourth signal.

* * * * *